United States Patent [19]

Takano

[11] Patent Number: 5,130,991
[45] Date of Patent: Jul. 14, 1992

[54] METHOD AND APPARATUS FOR CRC COMPUTATION

[75] Inventor: Masahiro Takano, Minamiashigara, Japan

[73] Assignee: Hitachi, Ltd., Tokyo, Japan

[21] Appl. No.: 280,430

[22] Filed: Dec. 6, 1988

[30] Foreign Application Priority Data

Dec. 8, 1987 [JP] Japan .................. 62-308690

[51] Int. Cl.$^5$ ........................................... H03M 13/00
[52] U.S. Cl. ..................................... 371/37.6; 371/53
[58] Field of Search ................. 371/37.1, 37.6, 40.1, 371/53

[56] References Cited

U.S. PATENT DOCUMENTS 4,105,999  8/1978  Nakamura ...................... 371/37.6
4,450,561  5/1984  Gotze et al. .................... 371/37.6

FOREIGN PATENT DOCUMENTS 60-230732  11/1985  Japan .

OTHER PUBLICATIONS

Boudreau, P. et al., "Parallel CRC Generation for Multilength Characters", IBM Technical Disclosure Bulletin, vol. 15, No. 4, Sep. 1972, pp. 1314-1315.
Hsiao, M. et al., "Serial-To-Parallel Transformations of Linear-Feedback ...", IEEE Trans. on Electronic Computer, vol. EC-13, Dec. 1984, pp. 738-740.
Weissberger, A., "An LSI Implementation of an Intelligent CRC Computer ...", IEEE Jour. of Solid-State Circuits, vol. SC-15, No. 1, Feb. 1980, pp. 52-60.
Helness, K., "Implementation of a Parallel Cyclic Redundancy Check Generator", Compouter DEsign, Mar. 1974, pp. 91-96.
Weissberger, A. et al., "Control Chip Handles Error Checking and Character-Based Protocols Easily", Electronics, Mar. 27, 1980, pp. 151-155.
Ramabadran, T. et al., "A Tutorial On CRC Computations", IEEE Micro, Aug. 1988, pp. 62-74.
IBM, TDM, vol. 27, No. 6, Nov. 1964, pp. 3572-3576, "Method for High-Speed CRC Computation", Nielson.

Primary Examiner—Stephen M. Baker
Attorney, Agent, or Firm—Fay, Sharpe, Beall, Fagan, Minnich & McKee

[57] ABSTRACT

In a CRC computation system, when 1-byte data is established on one of two buses, the 1-byte data is selected for a 1-byte-wise CRC computation, and when 1-byte data are established on both of the two buses, the 2-byte data are selected for a 2-byte-wise CRC computation. Either 1-byte data or 2-byte data as a result of the CRC computation is selected in accordance with a data selecting signal and held in accordance with a data holding signal.

4 Claims, 4 Drawing Sheets

$$\begin{pmatrix} Y_0 \\ Y_1 \\ \vdots \\ \vdots \\ Y_{15} \end{pmatrix} = A^{16} \begin{pmatrix} X_0 \\ X_1 \\ \vdots \\ \vdots \\ X_{15} \end{pmatrix} + B_{16} \begin{pmatrix} U_0 \\ U_1 \\ \vdots \\ \vdots \\ U_{15} \end{pmatrix}$$

$$A^{16} = \begin{pmatrix}
1 & 1 & 1 & 1 & 1 & 1 & 1 & 1 & 0 & 1 & 0 & 1 & 0 & 1 & 0 & 0 \\
1 & 0 & 0 & 0 & 0 & 0 & 0 & 0 & 1 & 1 & 1 & 1 & 1 & 1 & 1 & 0 \\
0 & 1 & 0 & 0 & 0 & 0 & 0 & 0 & 0 & 1 & 1 & 1 & 1 & 1 & 1 & 1 \\
0 & 0 & 1 & 0 & 0 & 0 & 0 & 0 & 0 & 0 & 1 & 1 & 1 & 1 & 1 & 1 \\
0 & 0 & 0 & 1 & 0 & 0 & 0 & 0 & 0 & 0 & 0 & 1 & 1 & 1 & 1 & 1 \\
0 & 0 & 0 & 0 & 1 & 0 & 0 & 0 & 0 & 0 & 0 & 0 & 1 & 1 & 1 & 1 \\
0 & 0 & 0 & 0 & 0 & 1 & 0 & 0 & 0 & 0 & 0 & 0 & 0 & 1 & 1 & 1 \\
0 & 0 & 0 & 0 & 0 & 0 & 1 & 0 & 0 & 0 & 0 & 0 & 0 & 0 & 1 & 1 \\
1 & 1 & 1 & 1 & 1 & 1 & 1 & 0 & 0 & 1 & 0 & 1 & 0 & 1 & 0 & 1 \\
0 & 1 & 1 & 1 & 1 & 1 & 1 & 1 & 0 & 0 & 1 & 0 & 1 & 0 & 1 & 0 \\
0 & 0 & 1 & 1 & 1 & 1 & 1 & 1 & 1 & 0 & 0 & 1 & 0 & 1 & 0 & 1 \\
0 & 0 & 0 & 1 & 1 & 1 & 1 & 1 & 1 & 1 & 0 & 0 & 1 & 0 & 1 & 0 \\
0 & 0 & 0 & 0 & 1 & 1 & 1 & 1 & 1 & 1 & 1 & 0 & 0 & 1 & 0 & 1 \\
0 & 0 & 0 & 0 & 0 & 1 & 1 & 1 & 1 & 1 & 1 & 1 & 0 & 0 & 1 & 0 \\
0 & 0 & 0 & 0 & 0 & 0 & 1 & 1 & 1 & 1 & 1 & 1 & 1 & 0 & 0 & 1 \\
1 & 1 & 1 & 1 & 1 & 1 & 1 & 0 & 1 & 0 & 1 & 0 & 1 & 0 & 0 & 0
\end{pmatrix}$$

$$B_{16} = \begin{pmatrix}
0 & 0 & 1 & 0 & 1 & 0 & 1 & 0 & 1 & 1 & 1 & 1 & 1 & 1 & 1 & 1 \\
0 & 1 & 1 & 1 & 1 & 1 & 1 & 1 & 0 & 0 & 0 & 0 & 0 & 0 & 0 & 0 \\
1 & 1 & 1 & 1 & 1 & 1 & 0 & 0 & 0 & 0 & 0 & 0 & 0 & 1 & 0 \\
1 & 1 & 1 & 1 & 1 & 1 & 0 & 0 & 0 & 0 & 0 & 0 & 1 & 0 & 0 \\
1 & 1 & 1 & 1 & 1 & 0 & 0 & 0 & 0 & 0 & 0 & 0 & 1 & 0 & 0 & 0 \\
1 & 1 & 1 & 1 & 0 & 0 & 0 & 0 & 0 & 0 & 0 & 1 & 0 & 0 & 0 & 0 \\
1 & 1 & 1 & 0 & 0 & 0 & 0 & 0 & 0 & 0 & 1 & 0 & 0 & 0 & 0 & 0 \\
1 & 1 & 0 & 0 & 0 & 0 & 0 & 0 & 0 & 1 & 0 & 0 & 0 & 0 & 0 & 0 \\
1 & 0 & 1 & 0 & 1 & 0 & 0 & 1 & 1 & 1 & 1 & 1 & 1 & 1 & 1 & 1 \\
0 & 1 & 0 & 1 & 0 & 1 & 0 & 0 & 1 & 1 & 1 & 1 & 1 & 1 & 1 & 0 \\
1 & 0 & 1 & 0 & 1 & 0 & 0 & 1 & 1 & 1 & 1 & 1 & 1 & 1 & 0 & 0 \\
0 & 1 & 0 & 1 & 0 & 0 & 1 & 1 & 1 & 1 & 1 & 1 & 1 & 0 & 0 & 0 \\
1 & 0 & 1 & 0 & 0 & 1 & 1 & 1 & 1 & 1 & 1 & 1 & 0 & 0 & 0 & 0 \\
0 & 1 & 0 & 0 & 1 & 1 & 1 & 1 & 1 & 1 & 1 & 0 & 0 & 0 & 0 & 0 \\
1 & 0 & 0 & 1 & 1 & 1 & 1 & 1 & 1 & 1 & 0 & 0 & 0 & 0 & 0 & 0 \\
0 & 0 & 0 & 1 & 0 & 1 & 0 & 1 & 0 & 1 & 1 & 1 & 1 & 1 & 1 & 1
\end{pmatrix}$$

METHOD AND APPARATUS FOR CRC COMPUTATION

BACKGROUND OF THE INVENTION

This invention relates to a method and apparatus for Cyclic Redundancy Check (will be termed "CRC" hereinafter) computation intended for data which is formed of a plurality of parallel bits, and particularly to a CRC computation method and apparatus suitable for the case where the number of parallel bits is varied.

There are known various methods for the computation of CRC used as an error detection character. One example is described in publication: IBM, TDM, Vol. 27, No. 6, November 1984, pp. 3572-3576. This method is categorized to be the CRC computation system in which data under test is subjected to bit-serial computation in accordance with a prescribed computation formula. The above publication presents the method of simultaneous parallel computation for a plurality of bits of data for accomplishing the same result as the case of bit-serial computation.

According to the above publication, for the state vector which represents a computation result up to the $(n-1)$th bit to be $\overline{X}(n)$, the input given at the $(n)$th bit to be $u(n)$, and the computation result following the input to be $\overline{X}(n+1)$, a state transition matrix A (16-by-16 matrix for 16-bit data) and an input vector $\overline{b}$(16-by-1 vector) are defined to meet:

$$\overline{X}(n+1) = A\overline{X}(n) + \overline{b}u(n) \qquad (1)$$

When 8 bits are entered simultaneously (these 8 bits form an input vector $\overline{u}(n, 8)$), then the computation is as follows.

$$\overline{X}(n+8) = A^8 \overline{X}(n) + B_8 \overline{u}(n, 8) \qquad (2)$$

$$B_8 = A^7\overline{b} A^6 \overline{b} A^5 \overline{b} A^4 \overline{b}) \qquad (3)$$

Consequently, the same computation result $\overline{X}(n+8)$ as the case of bit-wise input for the 8 bits is achieved.

The foregoing known technique features that the state vector $\overline{X}(n)$ is the same as the result of serial computation for the input of $n-1$ bits and even if the $n-1$ bits are computed for an arbitrary m-bit set (8 bits in the above case), the unique state vector $\overline{X}(n)$ is produced so far as the matrices $A^m$ and $B_m$ are used.

In general, information processing systems such as computers deal with data in units of byte (8 bits) in most cases, and the application of the above-mentioned multiple bits simultaneous computation system readily realizes a high-speed computation circuit.

Conventionally, data is transferred between a CPU and an external storage in units of byte (8 bits), whereas recent demands of high-speed data transmission are often met by transferring 2 bytes (16 bits) or more simultaneously. The 1-byte transfer is used for a transfer rate of 3 Mbps, while the 2-byte transfer is for 6 Mbps. The number of bytes of simultaneous transfer may vary depending on the partner (CPU) in connection (i.e., static change). In addition, the number of bytes of simultaneous transfer may vary during the transfer depending on the number of bytes of transferred data, the transfer control mode and the data recording mode of the storage (i.e., dynamic change). An example of the dynamic change is that data in blocks of an odd number $(2N+1)$ of bytes is transferred in 2-byte units in N cycles, which is followed by a cycle of 1-byte transfer. In order to assure the legitimacy of data transfer, CRC computation for transferred data is required.

However, the above-mentioned publication merely describes a general theory of CRC computation based on the m-bit parallel computation for accomplishing the same result as the bit-serial computation, and it does not deal with the simultaneous CRC computation useful for a data transfer system in which the number of bits or bytes of simultaneous transfer varies statically or dynamically.

SUMMARY OF THE INVENTION

Accordingly, an object of this invention is to overcome the foregoing prior art deficiency and provide a CRC computation system which readily performs a simultaneous CRC computation for data in which the number of bits or bytes transferred simultaneously varies statically or dynamically.

In order to achieve the above objective, the CRC computation method and apparatus of this invention comprises a plurality of simultaneous CRC computation means which implement combination logics compatible with a plurality of numbers of parallel bits of input data, a selection means which selectively enters input data to an input of the simultaneous CRC computation means in correspondence to the number of parallel bits of the input data, and a holding means which holds the output of the selected simultaneous CRC computation means.

According to a preferred embodiment of the invention, each of the simultaneous CRC computation means comprises a combination logic circuit which forms a matrix for implementing a logical operation by receiving the input data and the output of the holding means, thereby performing a simultaneous computation for a certain number of bits. The combination logic circuits are provided equal in number to kinds of the numbers of bits or bytes of simultaneous computation. One of the logic circuits is selected by switching statically or dynamically depending on the number of bits or bytes of input data, and the resulting computational output is held in a register (holding means), e.g., flip-flops. The holding means has its output used for the subsequent computation.

The action of the inventive CRC computation system is as follows. The simultaneous CRC computation means perform the computation as shown by the above equations (2) and (3). For the present state vector $\overline{X}(n)$, when i bits of input data are given simultaneously, the system selects a simultaneous computation means which performs the logical operations of equations (2) and (3), with numeral "8" being replaced with "i". When j bits of input data ($i \neq j$) are given simultaneously, the system selects a simultaneous computation means which performs the logical operation of the above equations (2) and (3), with numeral "8" being replaced with "j". Matrices $A^i$ and $B_i$ are used for the i-bit data and matrices $A^j$ and $B_j$ are used for the j-bit data for computing $\overline{X}(n+i)$ and $\overline{X}(n+j)$, respectively. Therefore, for variable values of i and j of input data, the system merely needs to change the computation (conversion) matrix accordingly, and a unique CRC computational result is obtained ultimately.

The computation takes place for data bits entered simultaneously, and the computation result is held at each time for the computation of subsequent data input. Therefore, the system is responsive not only to a static change in the number of bytes, such as the case of altered data transfer partner, but also to a dynamic change in which the number of bytes varies during data transfer.

As described, the inventive CRC computation system is intended for data in which the number of bits or bytes of simultaneous (parallel) input varies statically or dynamically, by selecting a simultaneous CRC logic circuit which fits the bit or byte length, whereby high-speed computation based on simultaneous operations is made possible and data with a variable bit or byte length during transfer, as well as before and after transfer, is readily rendered for the simultaneous CRC computation.

BRIEF DESCRIPTION OF THE DRAWINGS

FIG. 3 is a diagram showing an example of a computation formula dealt with by the 1-byte (8 bits) computation circuit of FIG. 2; and FIG. 4 is a diagram showing an example of a computation formula dealt with by the 2-byte (16 bits) computation circuit of FIG. 2.

DESCRIPTION OF THE PREFERRED EMBODIMENT

An embodiment of this invention applied to a magnetic tape controller will be described.

Figure 1:
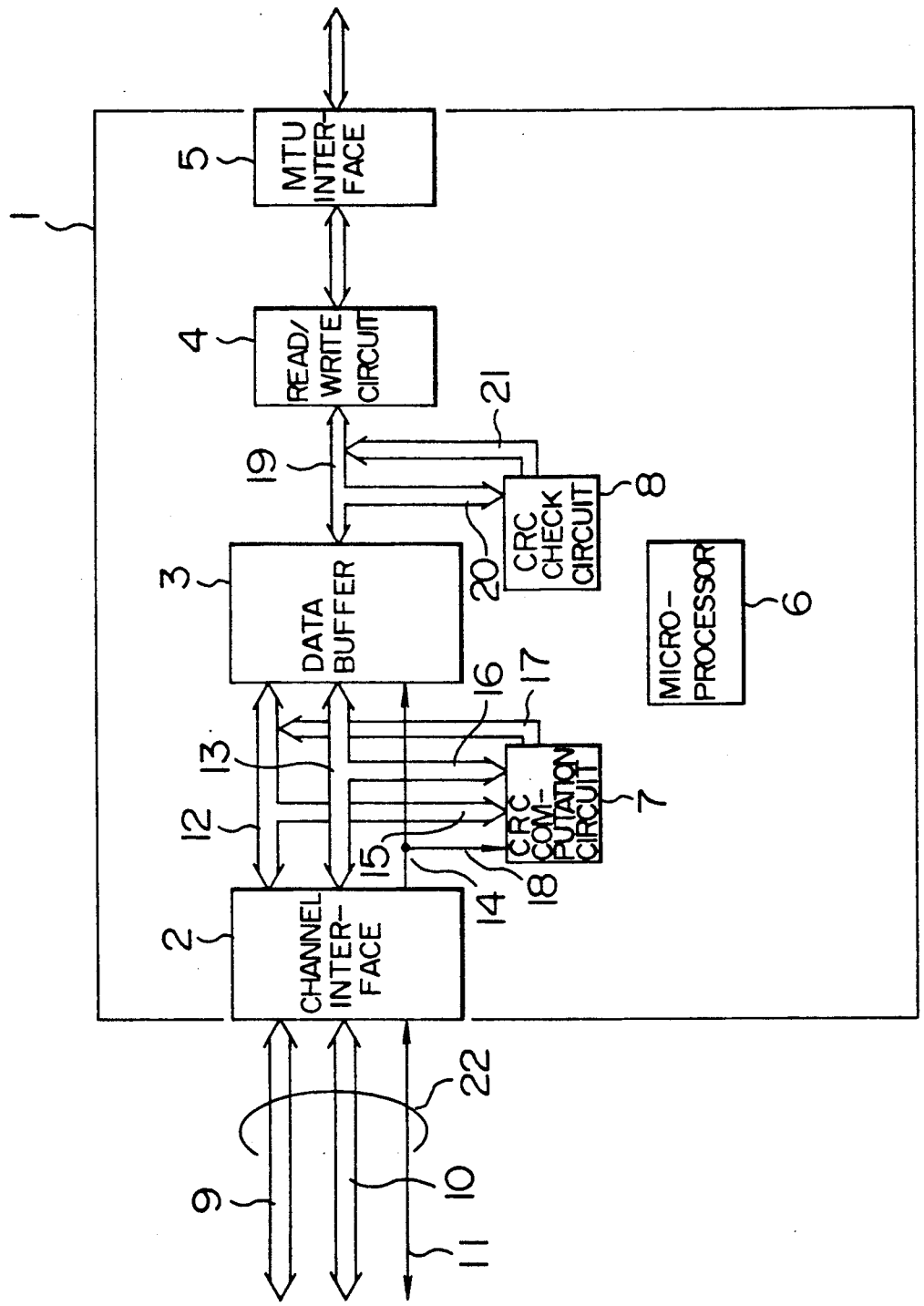
FIG. 1 is a block diagram showing the magnetic tape subsystem to which the CRC computation circuit of this invention is applied.

FIG. 1 is a block diagram showing a magnetic tape controller 1. The magnetic tape controller 1 is connected to a channel (not shown) through interface lines 22. A channel interface 2 controls the interface with the channel. A data buffer 3 temporarily holds data transferred from the channel or data read out of a magnetic tape unit (MTU) (not shown). A read/write circuit 4 modulates data written to the MTU and demodulates data read out of the MTU. A MTU interface 5 controls the interface with the MTU. These internal functional blocks of the magnetic tape controller 1 are controlled by a microprocessor 6.

The operation of writing data from the channel to the MTU will be described. Data from the channel are sent to the channel interface 2 over data buses 9 and 10 each having a 1-byte (8 bits) width. The data transfer is carried out by a pair of handshake lines going to the channel and coming from the channel included in signal lines 11.

The data received by the channel interface 2 are sent to the data buffer 3 over 1-byte data buses 12 and 13, and stored in the memory. Data transfer over the data buses 12 and 13 is carried out in synchronism with one of the signals of control bus 14 from the channel interface 2 to the data buffer 3. The data sent to the data buffer 3 over the data buses 12 and 13 is also sent over data buses 15 and 16 to a CRC computation circuit 7, in which the data undergoes a block-wise CRC computation, the result of which is delivered on data bus 17. CRC computation is carried out according to the signals of control bus 18. The CRC is of the type of bit-wise computation based on the following generation polynomial.

$$X^{16}+X^{15}+X+1 \qquad (4)$$

The result of computation is to be appended as a CRC code at the end of each data block, and it is held together with the data block in the data buffer 3. In response to the command of the microprocessor 6, a data block held in the data buffer 3 is sent to the read/write circuit 4 over a 1-byte data bus 19 and, after being modulated by the circuit 4, it is sent to the MTU by way of the MTU interface 5. The CRC code held with the data block in the data buffer 3 is sent to a CRC check circuit 8 on data bus 20 and used for the legitimacy test for the data block in the data buffer with the result being returned on data bus 21 3.

Depending on the channel connected, 2-byte data from the channel are sent over the buses 9 and 10 simultaneously, or 1-byte data from the channel is sent over the data bus 9. In the former case, if a data block is made up of an odd number 2N+1 of bytes, N bytes are sent simultaneously over the buses 9 and 10, and the last one byte is sent over the bus 9. In any case, the validity of data on the data buses 9 and 10 is indicated by respective signals among the signal lines 11, and based on it the channel specifies active data bus (buses). Similarly, there are two cases of 1-byte transfer and 2-byte transfer for data from the channel interface 2 to the data buffer 3, and the validity of data on the buses 9 and 10 is indicated by the signals among the signal lines 14. These operations are controlled by the microprocessor 6, and those unrelated to this invention are not explained here.

Figure 2:
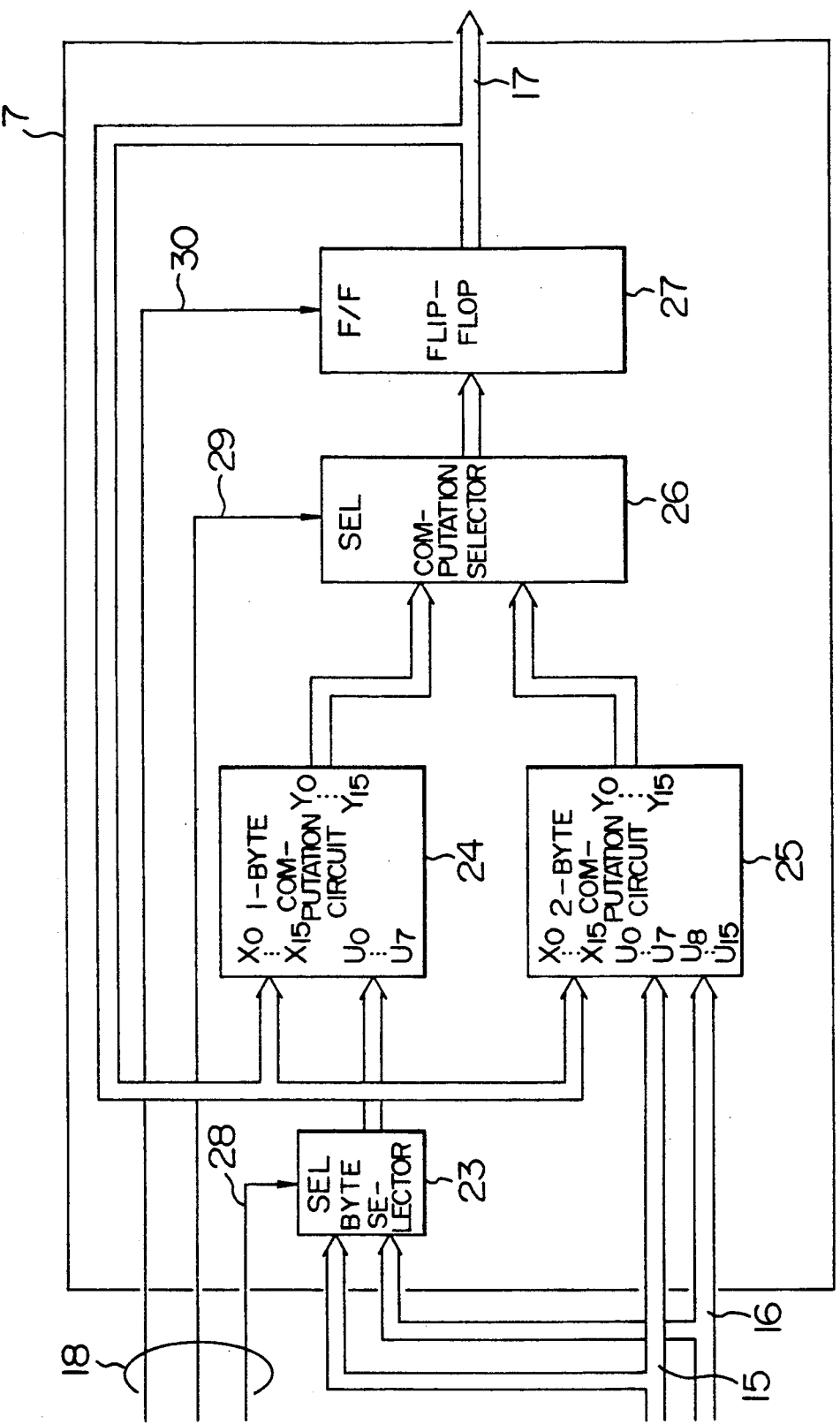
FIG. 2 is a block diagram showing the CRC computation circuit of FIG. 1.
Figure 3:
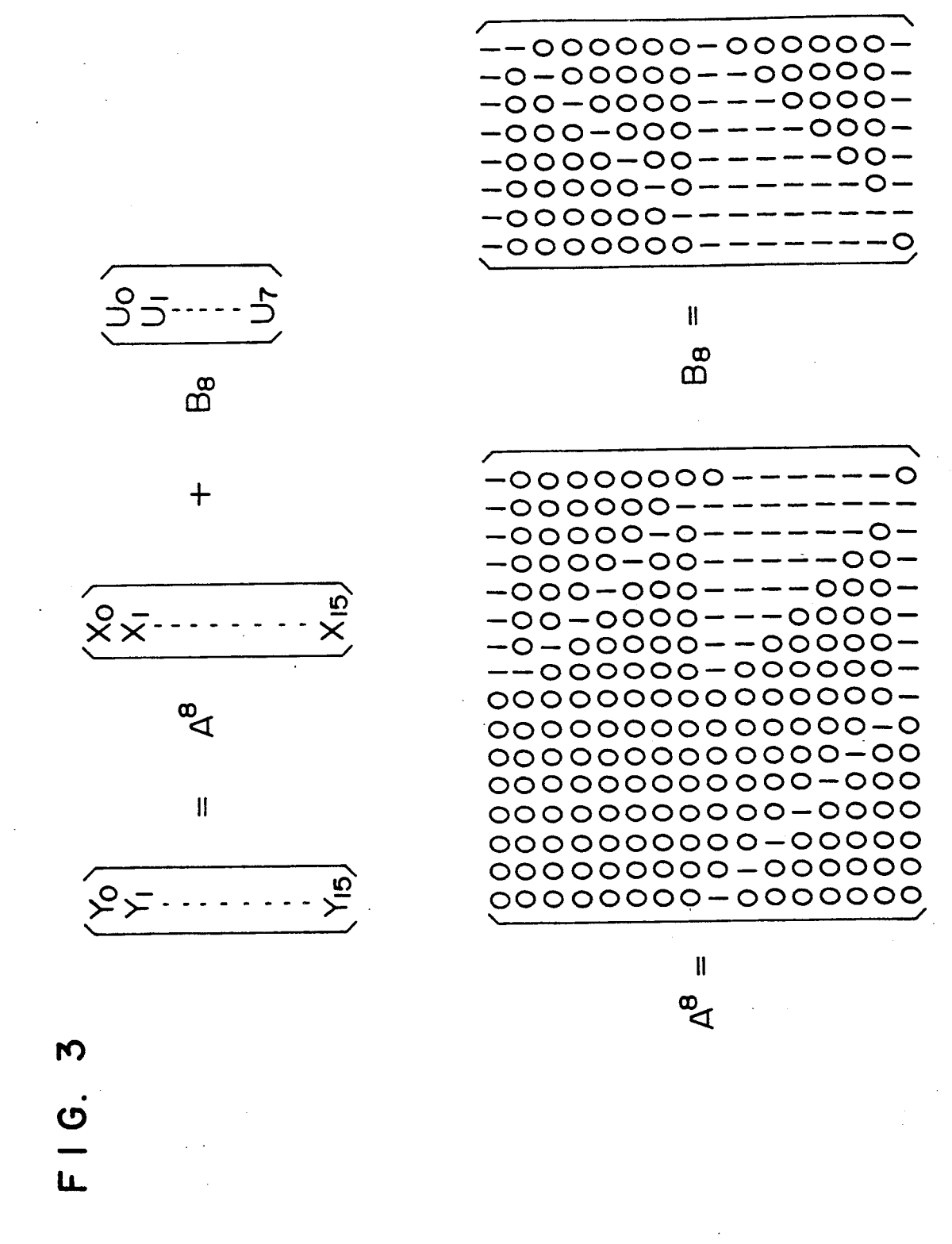

FIG. 2 shows the arrangement of the inventive CRC computation circuit 7. A 1-byte- computation circuit 24 is a combination circuit which computes the subsequent state from the present state and simultaneous 8-bit input data on the basis of the matrix shown in FIG. 3. For example, an output bit $Y_0$ is expressed in terms of inputs $X_0-X_{15}$ and $U_0-U_7$ as follows.

$$Y_0 = X_8 \oplus X_9 \oplus X_{10} \oplus X_{11} \oplus X_{12} \oplus X_{13} \oplus X_{14} \oplus X_{15} \oplus \qquad (5)$$
$$U_0 \oplus U_1 \oplus U_2 \oplus U_3 \oplus U_4 \oplus U_5 \oplus U_6 \oplus U_7$$

where symbol $\oplus$ represents an exclusive-OR operator.

Similarly, a 2-byte computation circuit 25 is a combination circuit which computes the subsequent state from the present state and simultaneous 16-bit input data on the basis of the matrix shown in FIG. 4.

Flip-flops 27 constitute a 16-bit register for holding intermediate and resultant data of computation, and it is rewritten by a clock signal on a signal line 30 in the bus 18 in synchronism with the data transfer on the buses 15 and 16.

A computation selector 26 is used to introduce either the output of the 1-byte computation circuit 24 or the output of the 2-byte computation circuit 25 into the flip-flops 27 as a result of computation. The selection of the input by the computation selector 26 is determined from whether 1-byte data or 2-byte data is valid on the buses 15 and 16, as indicated on a signal line 29 in the bus 18.

A bus selector 23 is controlled by a signal line 28 in the bus 18 to select valid 1-byte data on either bus 15 or 16 and enter the data into the 1-byte computation circuit 24. The result of computation is delivered as the subsequent state over bus 17. Part of the computation result is returned to the computation circuits 24 and 25, and it is used as the present state for the computation of subsequent input.

This embodiment enables the CRC computation for both of 1-byte input data and 2-byte input data. Moreover, even if the number of bytes of simultaneous input varies during the CRC computation for one data block, a correct computation result is reached ultimately. 1-byte input data may be established on any of the 2-byte buses to carry out the computation correctly.

While a preferred embodiment has been set forth along with modifications and variations to show specific advantageous details of the present invention, further embodiments, modifications and variations are contemplated within the broader aspects of the present invention, all as set forth by the spirit and scope of the following claims.

I claim:

1. A CRC computation system, comprising:
   a byte selector which selects one byte of data established on one of first and second buses in accordance with a byte selection signal applied thereto;
   a 1-byte computation circuit which receives the one byte of data selected by said byte selector, implements a 1-byte-wise CRC computation, and outputs a first data output of two bytes;
   a 2-byte computation circuit which receives first and second data of one byte each established on said first and second buses, respectively, implements a 2-byte-wise CRC computation and outputs a second data output of two bytes;
   a computation selector which selectively receives the first or second 2-byte output from said 1-byte computation circuit or from said 2-byte computation circuit, respectively, in accordance with a data selection signal applied thereto; and
   flip-flop means which hold an intermediate state and a result of computation for the data selected by said computation selector in accordance with a data holding signal applied thereto.

2. A CRC computation system comprising:
   an input data bus;
   an i-bit first computation circuit which receives i-bit input data from said input data bus and implements i-bit-wise CRC computation;
   a j-bit second computation circuit, separate from said i-bit computation circuit, which receives j-bit input data from said input data bus and implements j-bit-wise CRC computation, where $j > i$;
   a computation selector which has plural inputs that respectively receives j-bit result data as a result of CRC computation by said i-bit first computation circuit and j bit result data as a result of CRC computation by said j-bit second computation circuit and selectively connects one of the plural inputs to an output in accordance with a data selection signal applied thereto; and
   storage means connected to the output to hold a result of computation for the result data selected by said computation selector in accordance with a data holding signal applied thereto.

3. A CRC computation system comprising:
   a selector which selects i-bit data established on one of two i-bit wide input data buses in accordance with a selection signal applied thereto;
   an i-bit computation circuit which receives the i-bit input data selected by said selector and implements an i-bit-wise CRC computation;
   a 2i-bit computation circuit which receives 2i-bit input data established on both of the two buses and implements a 2i-bit-wise CRC computation; and
   storage means which hold a result of computation for the input data selected by said selector in accordance with a data holding signal applied thereto.

4. A CRC computation method comprising:
   selecting i-bit input data established on one of two buses in accordance with an i-bit selecting signal applied thereto during a first time period;
   receiving the i-bit input data selected as only a fixed one of the most significant bits and least significant bits of 2i-bits and implementing CRC computation during the first time period to produce a 2i-bit result;
   receiving 2i-bit input data established on both of the two buses and implementing CRC computation during a second time period to produce a 2i-bit result; and
   holding in a common storage area the 2i-bit result of computation for each time period in accordance with a data holding signal applied thereto.

* * * * *